United States Patent [19]

Miyashita

[11] Patent Number: 5,467,060
[45] Date of Patent: Nov. 14, 1995

[54] VOLTAGE CONTROLLED OSCILLATOR HAVING A CURRENT MIRROR CIRCUIT AS CURRENT SOURCE

[75] Inventor: Takumi Miyashita, Kawasaki, Japan

[73] Assignee: Fujitsu Limited, Kawasaki, Japan

[21] Appl. No.: 233,875

[22] Filed: Apr. 26, 1994

[30] Foreign Application Priority Data

Jun. 1, 1993 [JP] Japan ................................ 5-130380

[51] Int. Cl.⁶ .......................... H03B 5/00; H03B 5/24; H03L 7/099
[52] U.S. Cl. ................................ 331/74; 331/34; 331/57; 331/177 R; 331/182
[58] Field of Search .................... 331/34, 57, 177 R, 331/74, 143, 182

[56] References Cited

U.S. PATENT DOCUMENTS

| | | | |
|---|---|---|---|
| 5,061,907 | 10/1991 | Rasmussen | 331/57 |
| 5,075,640 | 12/1991 | Miyazawa | 331/34 X |
| 5,105,169 | 4/1992 | Yamazaki et al. | 331/34 |
| 5,142,249 | 8/1992 | Hirotomi | 331/177 R X |

*Primary Examiner*—David Mis
*Attorney, Agent, or Firm*—Armstrong, Westerman, Hattori, McLeland and Naughton

[57] ABSTRACT

A voltage controlled oscillator circuit is provided with a voltage controlled current source supplying a first current which is controlled responsive to a control voltage; and a current mirror circuit including input side circuit means and output side circuit means. The input side circuit means receives the first current from the voltage controlled current source. The claimed voltage controlled oscillator circuit further includes an oscillator circuit using the output side circuit means of the current mirror circuit as current source means and having an oscillation frequency which is controlled responsive to a second current of the output side circuit means; and an output circuit obtaining an oscillation output of the oscillator circuit. The oscillation output of the oscillator includes complementary outputs, wherein the output circuit includes two source follower circuits coupled to the complementary outputs, two pseudo resistor circuits, and another current mirror circuit, and wherein the two source follower circuits are respectively coupled to input side means and output side means of the another current mirror circuit through the pseudo resistor circuits, and the output is obtained from between the output side means of the another current mirror circuit and the source follower circuit.

9 Claims, 8 Drawing Sheets

5,467,060

VOLTAGE CONTROLLED OSCILLATOR HAVING A CURRENT MIRROR CIRCUIT AS CURRENT SOURCE

BACKGROUND OF THE INVENTION

The present invention generally relates to voltage controlled oscillator circuits, and more particularly to a voltage controlled oscillator circuit which is used for example when forming an internal clock signal generating circuit provided in a digital signal processor (DSP), a microprocessor unit (MPU) or the like.

FIG. 1 shows an example of a conventional voltage controlled oscillator circuit. This voltage controlled oscillator circuit is formed by a GaAs integrated circuit and includes an oscillator circuit part 1 and an output circuit part 2 for obtaining an oscillation output of the oscillator circuit part 1. In FIG. 1, $V_{DD}$ denotes a power supply line.

The oscillator circuit part 1 includes a voltage controlled current source 3 and a ring oscillator circuit 6.

The voltage controlled current source 3 includes a control voltage input terminal 4 and a depletion type metal semiconductor field effect transistor (MESFET) 5. An output current $I_0$ of the voltage controlled current source 3 is controlled by a control voltage $V_C$ which is applied to the control voltage input terminal 4.

The ring oscillator circuit 6 includes inverters 8, 9 and 10. More particularly, the ring oscillator circuit 6 includes resistors 11, 12 and 13, enhancement type MESFETs 14, 15 and 16, and capacitors 17, 18 and 19. The resistors 11 through 13 form load elements, the enhancement type MESFETs 14 through 16 form driving elements, and the capacitors 17 through 19 form delay elements.

On the other hand, the output circuit part 2 includes a level conversion circuit 20 and an inverter 25.

The level conversion circuit 20 converts the level of an oscillation output received from the ring oscillator circuit 6. The level conversion circuit 20 includes Schottky diodes 21, 22 and 23, and a depletion type MESFET 24.

The inverter 25 includes a depletion type MESFET 27 and an enhancement type MESFET 28. The depletion type MESFET 27 forms a load element, and the enhancement type MESFET 28 forms a driving element.

FIG. 2 shows an operation characteristic of the voltage controlled oscillator circuit shown in FIG. 1. In FIG. 2, a solid line 29 indicates a change of the oscillation frequency of the ring oscillator circuit 6 with respect to the control voltage $V_C$, and a solid line 30 indicates a change of a center level of the oscillation output of the ring oscillator circuit with respect to the control voltage $V_C$.

According to the voltage controlled oscillator circuit shown in FIG. 1, since the voltage controlled current source 3 which controls the oscillation frequency of the ring oscillator circuit 6 is formed solely by the single depletion type MESFET 5, a current will flow between the gate and source of the MESFET 5 if the control voltage $V_C$ is increased to a voltage of −0.4 to 0.8 V. As a result, it was impossible to greatly change the control voltage $V_C$, and there was a problem in that the oscillation frequency range cannot be made large.

On the other hand, the level conversion circuit 20 of the output circuit part 2 uses the Schottky diodes 21 through 23. For this reason, the Schottky diodes 21 through 23 may turn OFF when the center level of the oscillation output of the ring oscillator circuit 6 varies, and there was a problem in that the oscillation output may not be obtained in such a case.

SUMMARY OF THE INVENTION

Accordingly, it is a general object of the present invention to provide a novel and useful voltage controlled oscillator circuit in which the problems described above are eliminated.

Another and more specific object of the present invention is to provide a voltage controlled oscillator circuit comprising a voltage controlled current source supplying a first current which is controlled responsive to a control voltage, a current mirror circuit including input side circuit means and output side circuit means, where the input side circuit means receives the first current from the voltage controlled current source, an oscillator circuit using the output side circuit means of the current mirror circuit as current source means and having an oscillation frequency which is controlled responsive to a second current of the output side circuit means, and an output circuit obtaining an oscillation output of the oscillator circuit. According to the voltage controlled oscillator circuit of the present invention, the oscillator circuit uses the output side circuit means of the current mirror circuit as the current source, and the oscillation frequency is controlled depending on the second current of the output side circuit means. However, even if the varying range of the first current supplied to the input side circuit means is set large, the current mirror circuit can supply the corresponding first current to the output side circuit means. As a result, the tolerable varying range of the control voltage input to the voltage controlled current source can be set large, and it is possible to increase the oscillation frequency range.

Other objects and further features of the present invention will be apparent from the following detailed description when read in conjunction with the accompanying drawings.

BRIEF DESCRIPTION 0F THE DRAWINGS

DESCRIPTION OF THE PREFERRED EMBODIMENTS

Figure 1:
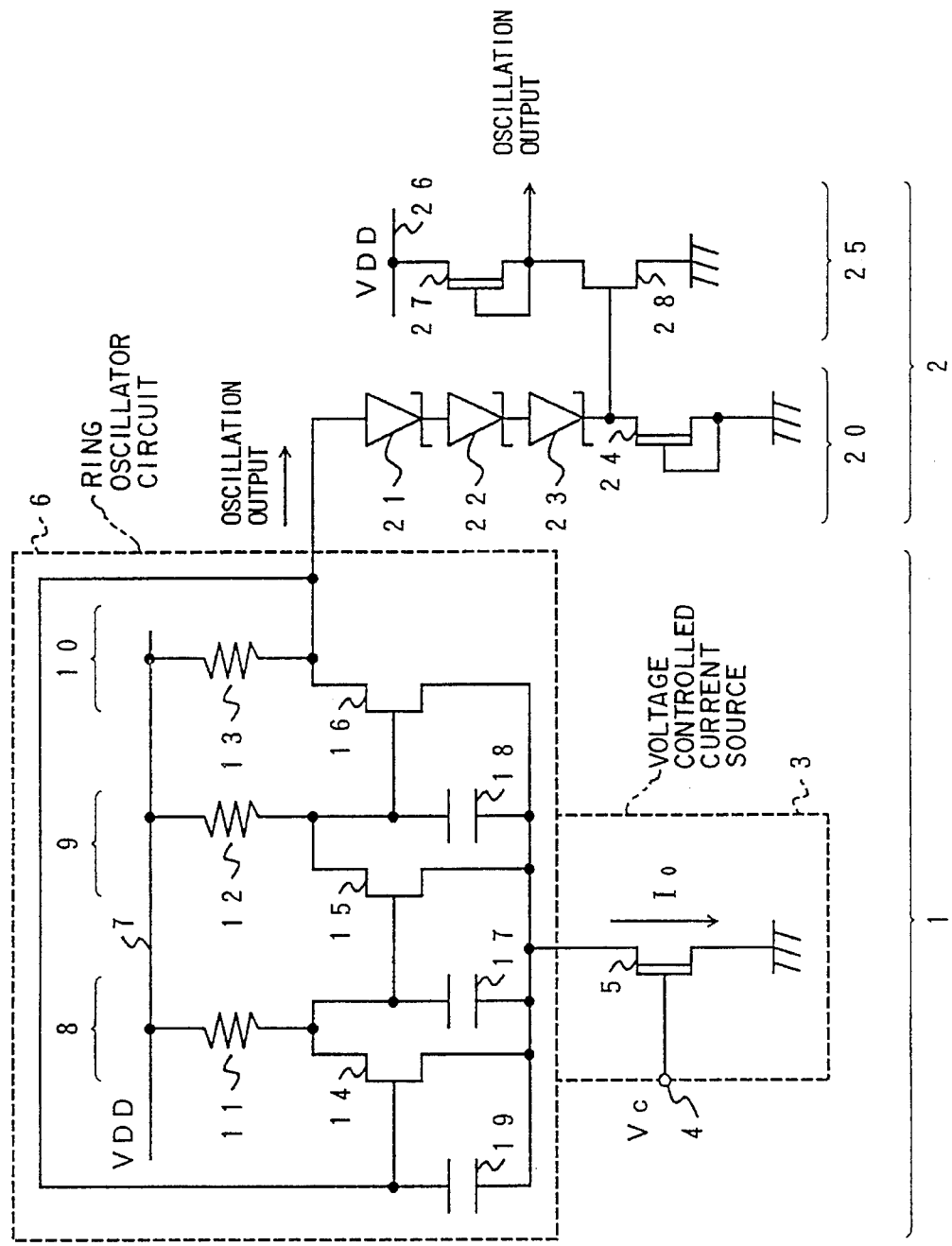
FIG. 1 is a circuit diagram showing an example of a conventional voltage controlled oscillator circuit.
Figure 2:
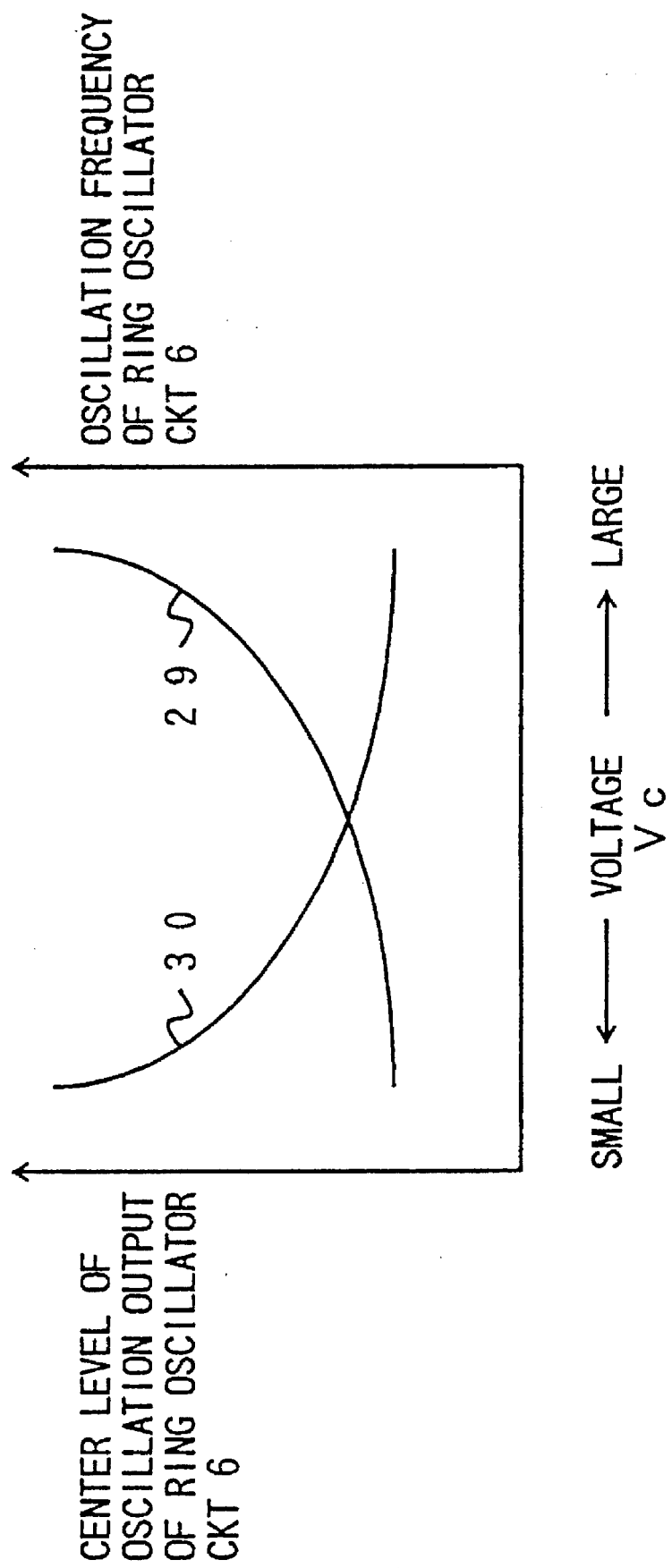
FIG. 2 is a diagram showing a characteristic of the voltage controlled oscillator circuit shown in FIG. 1.
Figure 3:
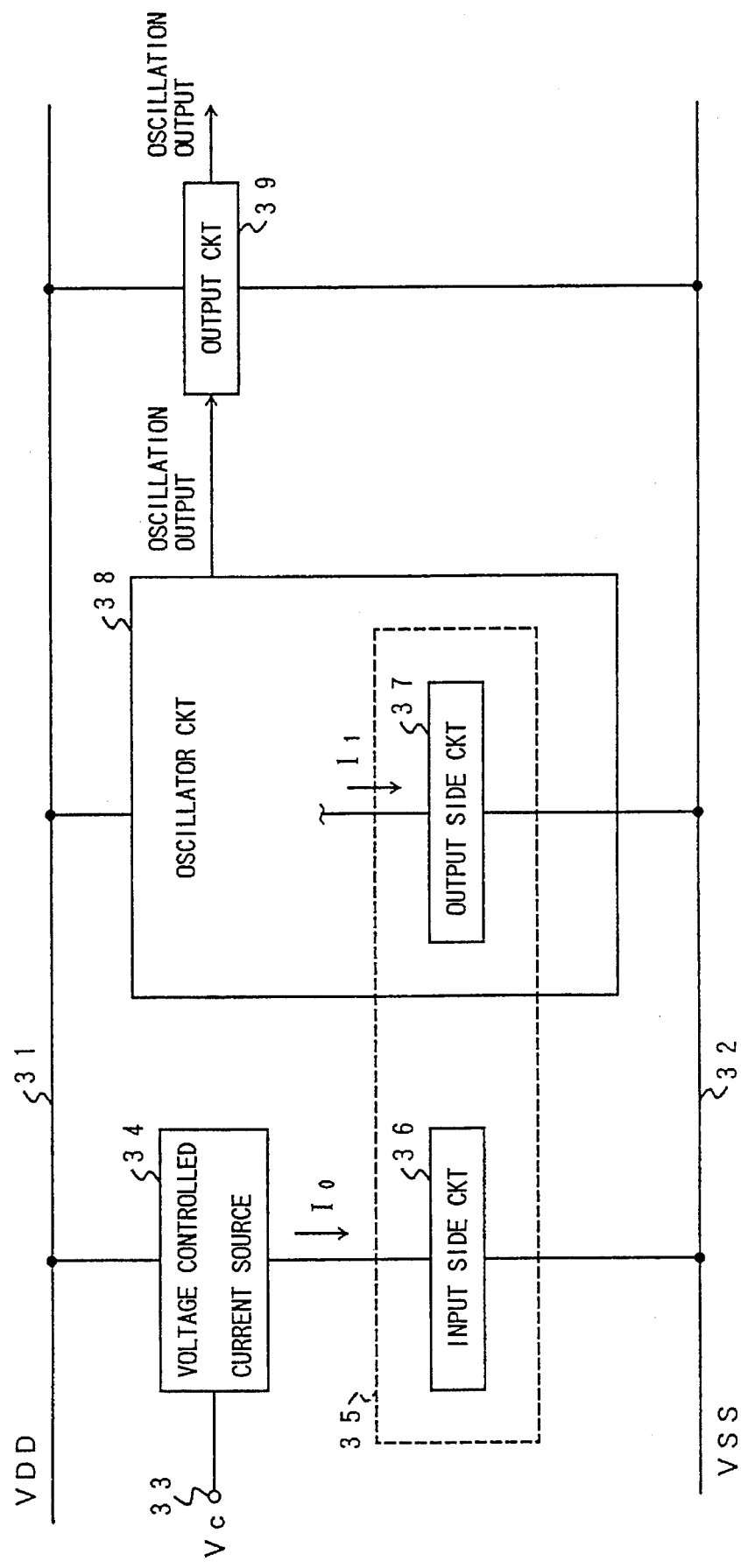
FIG. 3 is a block diagram for explaining the operating principle of the present invention.

First, a description will be given of the operating principle of the present invention, by referring to FIG. 3.

A voltage controlled oscillator circuit according to the present invention includes a power supply line 31 for supplying a high voltage side power supply voltage $V_{DD}$, a power supply line 32 for supplying a low voltage side power supply voltage $V_{SS}$, a control voltage input terminal 33, a voltage controlled current source 34, a current mirror circuit 35, an oscillator circuit 38, and an output circuit 39.

A control voltage $V_C$ is input to the control voltage input terminal 33, and an output current $I_0$ of the voltage controlled current source 34 is controlled by the control voltage $V_C$.

The current mirror circuit 35 includes an input side circuit 36 and an output side circuit 37. The output current $I_0$ of the voltage controlled current source 34 is input to the input side circuit 36, and a current $I_1$ corresponding to the output current $I_0$ flows through the output side circuit 37.

The oscillator circuit 38 uses the output side circuit 37 of the current mirror circuit 35 as a current source. An oscillation frequency of the oscillator circuit 38 is controlled by the current $I_1$ flowing through the output side circuit 37.

The output circuit 39 obtains an oscillation output of the oscillator circuit 38.

In other words, the voltage controlled oscillator circuit according to the present invention includes the voltage controlled current source 34 which is used as a current source and outputs the output current $I_0$ which is controlled by the control voltage $V_C$, the current mirror circuit 35 which has the input side circuit 36 supplied with the output current $I_0$ of the voltage controlled current source 34, the oscillator circuit 38 which uses the output side circuit 37 of the current mirror circuit 35 as a current source and is controlled of the oscillation frequency by the current $I_1$ of the output side circuit 37 of the current mirror circuit 35, and the output circuit 39 which obtains the oscillation output of the oscillator circuit 38.

According to the present invention, the oscillator circuit 38 uses the output side circuit 37 of the current mirror circuit 35 as the current source. The oscillation frequency of the oscillator circuit 38 is controlled by the current $I_1$ of the output side circuit 37. Even if the varying range of the output current $I_0$ supplied to the input side circuit 36 is set large, the current mirror circuit 35 can supply a corresponding current $I_1$ to the output side circuit 37.

As a result, the tolerable varying range of the control voltage $V_C$ which is input to the voltage controlled current source 34 can be set large, and it is thus possible to increase oscillation frequency range.

Next, a description will be given of a first embodiment of the voltage controlled oscillator circuit according to the present invention, by referring to FIGS. 4 through 6.

Figure 4:
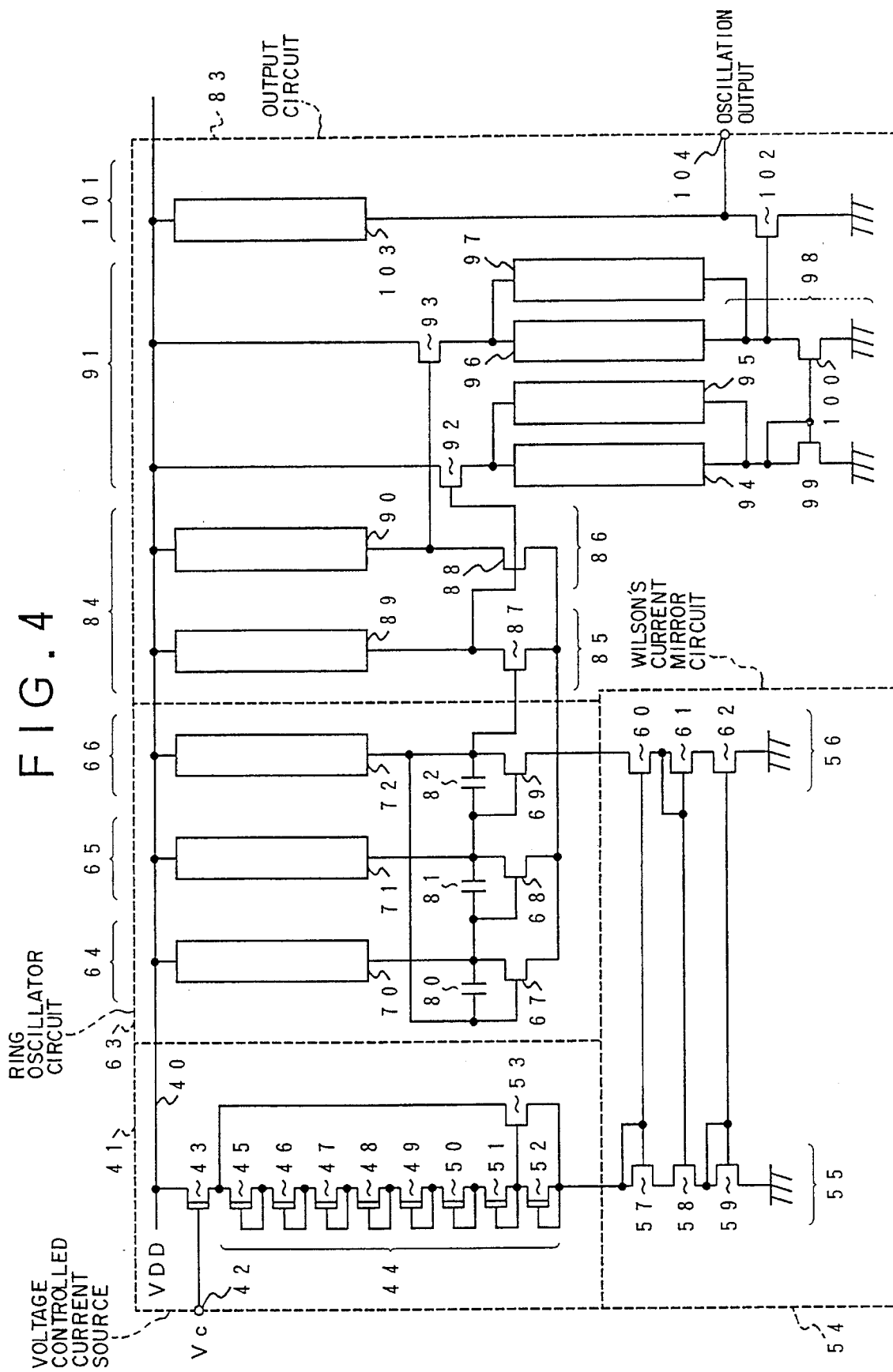
FIG. 4 is a circuit diagram showing a first embodiment of a voltage controlled oscillator circuit according to the present invention.

FIG. 4 is a circuit diagram showing the first embodiment of the present invention. In FIG. 4, a power supply line 40 supplies a power supply voltage $V_{DD}$ of 5 V, for example.

A voltage controlled current source 41 includes a control voltage input terminal 42 for receiving a control voltage $V_C$, a depletion type MESFET 43 forming an input transistor, and a pseudo resistor circuit (resistor equivalent circuit) 44. The pseudo resistor circuit 44 may be regarded as being equivalent to a pure resistance having a linear current-voltage characteristic. The pseudo resistor circuit 44 includes depletion type MESFETs 45 through 52 and an enhancement type MESFET 53 which are connected as shown in FIG. 4.

Of course, it is possible to provide a depletion type MESFET which is connected similarly to the enhancement type MESFET 53 in place of the enhancement type MESFET 53.

A Wilson's current mirror circuit 54 includes an input side circuit 55 which receives an output current $I_0$ of the voltage controlled current source 41, and an output side circuit 56 which is designed so that a current $I_1$ identical to the output current $I_0$ flows through the output side circuit 56.

The input side circuit 55 includes enhancement type MESFETs 57 through 59, and the output side circuit 56 includes enhancement type MESFETs 60 through 62. The current characteristic of the Wilson's current mirror circuit 54 can be improved as the number of stages is increased, that is, as the number of the enhancement type MESFETs forming the input side circuit 55 and the output side circuit 56 is increased.

A ring oscillator circuit 63 uses the output side circuit 56 of the Wilson's current mirror circuit 54 as a current source, and the oscillation frequency of the ring oscillator circuit 63 is controlled by the current $I_1$ of the output side circuit 56 of the Wilson's current mirror circuit 54. The so-called current hunger type oscillator circuit is formed by the output side circuit 56 of the Wilson's current mirror circuit 54 and the ring oscillator circuit 63.

The ring oscillator circuit 63 includes inverters 64 through 66. More particularly, the ring oscillator circuit 63 includes enhancement type MESFETs 67 through 69 which form driving elements, pseudo resistor circuits 70 through 72 which may be regarded as being equivalent to pure resistances having a linear current-voltage characteristic, and capacitors 80 through 82. The pseudo resistor circuits 70 through 72 form load elements with respect to the enhancement type MESFETs 67 through 69. The capacitors 80 through 82 are made of depletion type MESFETs and form mirror capacitances.

The pseudo resistor circuits 70 through 72 have the same circuit construction. FIG. 5 shows an embodiment of the construction of the pseudo resistor circuit 70 (71 and 72). The pseudo resistor circuit 70 includes depletion type MESFETs 73 through 78 and an enhancement type MESFET 79 which are connected as shown in FIG. 5.

An output circuit 83 shown in FIG. 4 includes a buffer circuit 84, a level conversion circuit 91, and an inverter 101.

The buffer circuit 84 includes inverters 85 and 86. More particularly, the buffer circuit 84 includes enhancement type MESFETs 87 and 88 which form driving elements, and pseudo resistor circuits 89 and 90 which form load elements with respect to the enhancement type MESFETs 87 and 88. The pseudo resistor circuits 89 and 90 have the same circuit construction, and may have the construction shown in FIG. 5, similarly as in the case of the pseudo resistor circuits 70 through 72 described above.

The level conversion circuit 91 includes enhancement type MESFETs 92 and 93, pseudo resistor circuits 94 through 97, and a current mirror circuit 98. The pseudo resistor circuits 94 through 97 have the same circuit construction, and may have the construction shown in FIG. 5, similarly as in the case of the pseudo resistor circuits 70 through 72 described above. The current mirror circuit 98 includes enhancement type MESFETs 99 and 100.

The inverter 101 includes an enhancement type MESFET 102 which forms a driving element, a pseudo resistor circuit 103 which forms a load element with respect to the enhancement type MESFET 102, and an oscillation output terminal 104. The pseudo resistor circuit 103 may have the construction shown in FIG. 5, similarly as in the case of the pseudo resistor circuits 70 through 72 described above. An oscillation output of the voltage controlled oscillator circuit is output via the oscillation output terminal 104.

Figure 6:
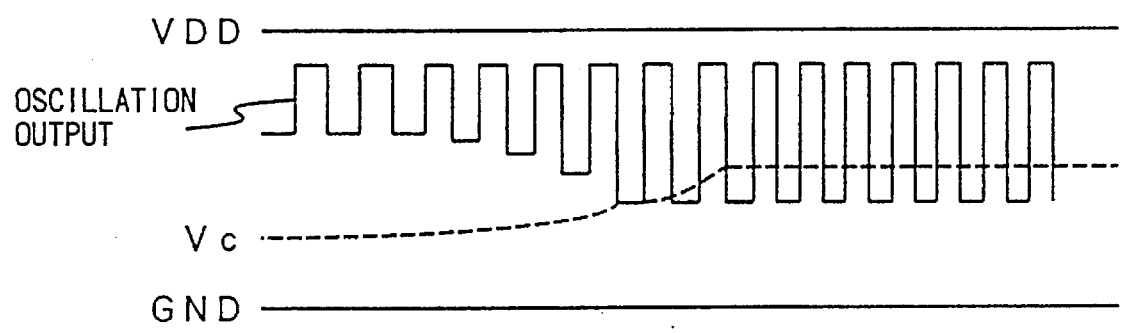
FIG. 6 is a diagram for explaining the operation of the first embodiment.

FIG. 6 is a diagram for explaining the operation of this first embodiment. FIG. 6 shows the relationship of the control voltage $V_C$ input to the control voltage input terminal 42 and the oscillation output output via the oscillation output terminal 104.

According to this first embodiment, the control voltage $V_C$ input to the control voltage input terminal 42 is converted into a current in the voltage controlled current source 41, and the output current $I_0$ which corresponds to the voltage value of the control voltage $V_C$ is output from the voltage controlled current source 41. As a result, the current $I_1$ which has the same current value as the output current $I_0$ flows through the output side circuit 56 of the Wilson's current mirror circuit 54. The ring oscillator circuit 63 thus outputs the oscillation output having the oscillation frequency corresponding to the current value of the current $I_1$. In addition, the oscillation output of the ring oscillator circuit 63 is output as the oscillation output of the voltage controlled oscillator circuit via the buffer circuit 84, the level conversion circuit 91 and the inverter 101.

In this first embodiment, the input transistor of the voltage controlled current source 41 is formed by the depletion type MESFET 43. The source of this depletion type MESFET 43 is connected to the pseudo resistor circuit 44 which may be regarded as being equivalent to a pure resistance having a linear current-voltage characteristic. In addition, the input side of the Wilson's current mirror circuit 54 has a low impedance, and may essentially be regarded as being a constant voltage. For this reason, even if the tolerable varying range of the control voltage $V_C$ is set large, a satisfactory voltage-current conversion is made, and it is possible to obtain the current $I_1$ which corresponds to the control voltage $V_C$.

Furthermore, in this first embodiment, the output current $I_0$ of the voltage controlled current source 41 is supplied to the input side circuit 55 of the Wilson's current mirror circuit 54, and the output side circuit 56 of this Wilson's current mirror circuit 55 is used as the current source to drive the ring oscillator circuit 63. However, even if the output current $I_0$ supplied to the input side circuit 55 is varied to a large current value in the Wilson's current mirror circuit 54, it is possible to flow the current $I_1$ which has the same current value as the output current $I_0$ to the output side circuit 56.

Therefore, according to this first embodiment, the tolerable varying range of the control voltage $V_C$ can be set large, and it is possible to increase the range of the oscillation frequency.

Moreover, this embodiment provides as the load elements forming the inverters 64 through 66 of the ring oscillator circuit 63 the pseudo resistor circuits 70 through 72 which may be regarded as being equivalent to the pure resistance having the linear current-voltage characteristic. For this reason, it is possible to reduce the variation of the oscillation frequency caused by the variation of the power supply voltage $V_{DD}$.

In addition, this first embodiment can obtain the oscillation output having a large amplitude because the output of the ring oscillator circuit 63 is obtained via the buffer circuit 84, the level conversion circuit 91 and the inverter 101, where the level conversion circuit 91 includes the enhancement type MESFETs 92 and 93 forming a source-follower circuit, the pseudo resistor circuits 94 through 97 and the current mirror circuit 98.

In this case, the voltage of the oscillation output is dispersed by the enhancement type MESFETs 92 and 93 forming the source-follower circuit, the depletion type MESFETs forming the pseudo resistor circuits 94 through 97 and the enhancement type MESFETs 99 and 100 forming the current mirror circuit 98. Thus, it is possible to prevent an abnormal operation which would occur when the Schottky gate turns ON.

Next, a description will be given of a second embodiment of the voltage controlled oscillator circuit according to the present invention, by referring to FIGS. 7 and 8.

Figure 7:
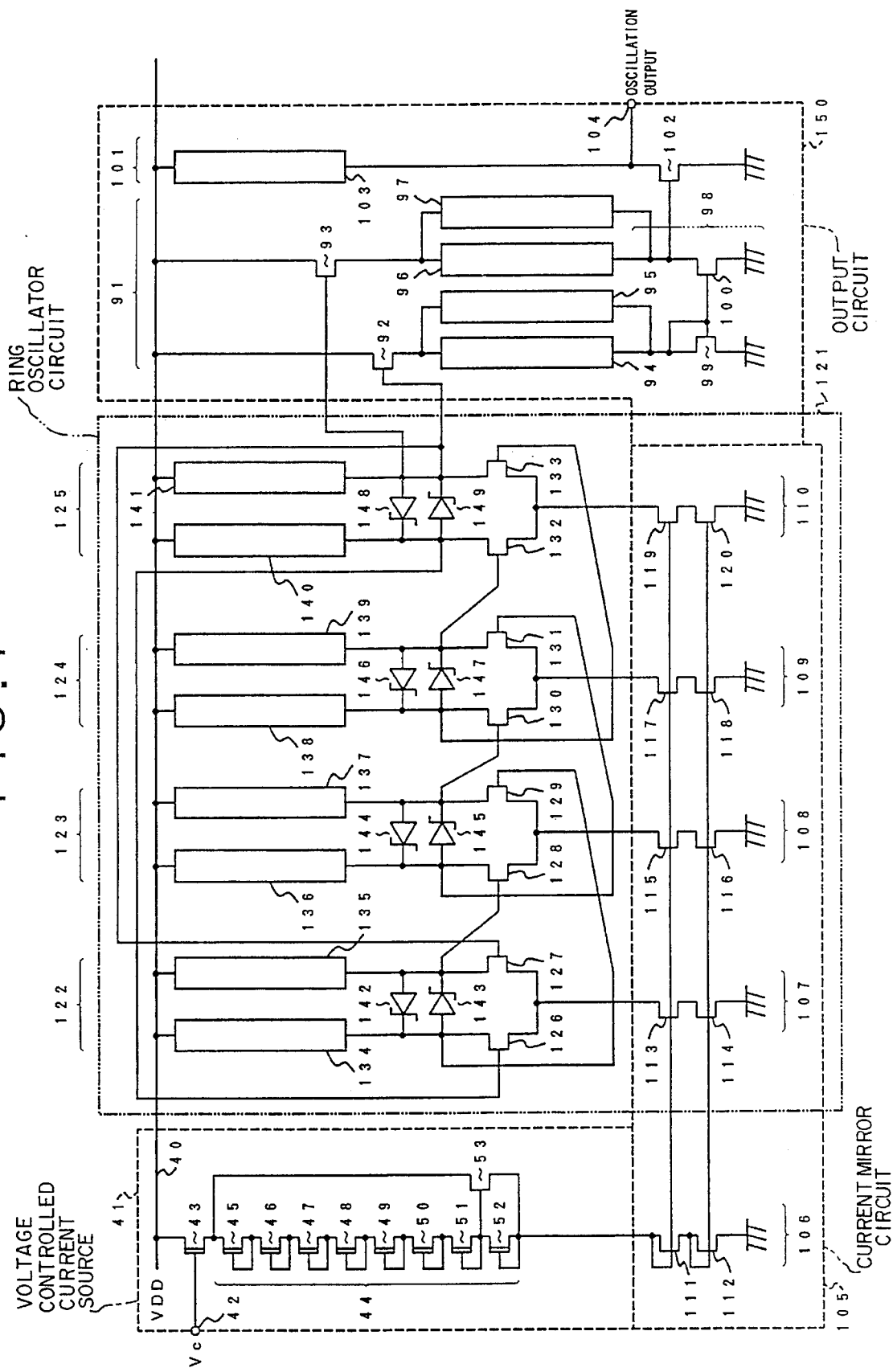
FIG. 7 is a circuit diagram showing a second embodiment of the voltage controlled oscillator circuit according to the present invention.

FIG. 7 shows the second embodiment of the present invention. In FIG. 7, the voltage controlled current source 41 has the same construction as that of the first embodiment shown in FIG. 4, and a description thereof will be omitted.

A current mirror circuit 105 shown in FIG. 7 has a 2-stage construction including an input side circuit 106, and output side circuits 107 through 110. The output current $I_0$ of the voltage controlled current source 41 is input to the input side circuit 106. The current $I_1$ which has the same current value as the output current $I_0$ flows through the output side circuits 107 through 110.

More particularly, the current mirror circuit 105 includes enhancement type MESFETs 111 through 120. A more satisfactory current characteristic can be obtained as the number of stages of the current mirror circuit 105 is increased, that is, as the number of enhancement type MESFETs forming the input side circuit 106 and the output side circuits 107 through 110 is increased.

A ring oscillator circuit 121 includes differential circuits (differential inverters) 122 through 125 which use the output side circuits 107 through 110 of the current mirror circuit 105 as current sources. The differential circuits 122 through 125 include enhancement type MESFETs 126 through 133 which form driving elements, pseudo resistor circuits 134 through 141 which may be regarded as being equivalent to a pure resistance having a linear current-voltage characteristic, and an amplitude limiting circuit which includes diodes 142 through 149 formed by depletion type MESFETs.

Figure 5:
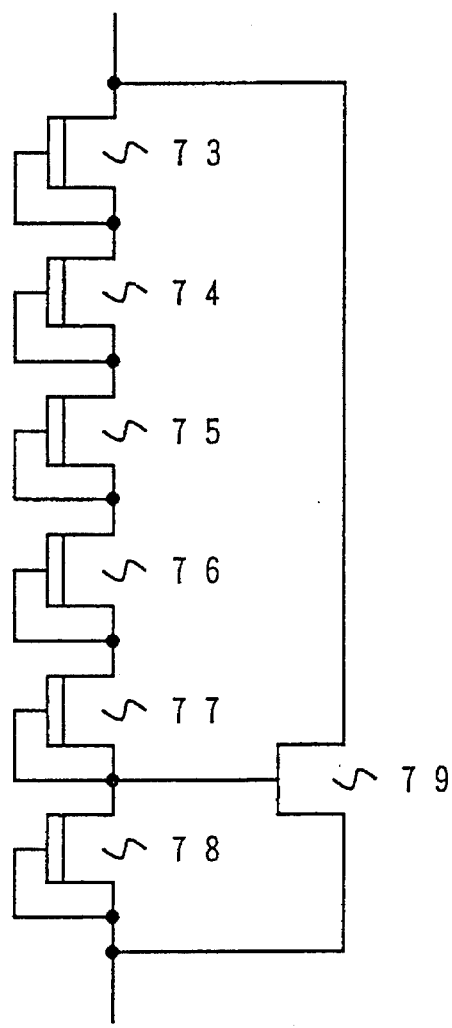
FIG. 5 is a circuit diagram showing an embodiment of a pseudo resistor circuit.

The pseudo resistor circuits 134 through 141 form load elements with respect to the enhancement type MESFETs 126 through 133, and may have the construction shown in FIG. 5.

In other words, the ring oscillator circuit 121 is formed by the differential circuits 122 through 125 which use the corresponding output side circuits 107 through 110 of the current mirror circuit 105 as the current sources peculiar thereto, and are connected in a ring.

An output circuit 150 includes the level conversion circuit 91 and the inverter 101 of the first embodiment described above.

Figure 8:
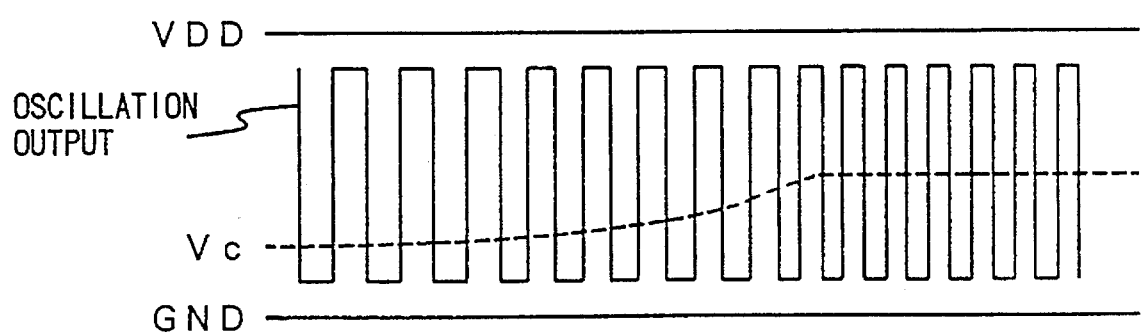
FIG. 8 is a diagram for explaining the operation of the second embodiment.

FIG. 8 is a diagram for explaining the operation of this second embodiment. FIG. 8 shows the relationship of the control voltage $V_C$ input to the control voltage input terminal 42 and the oscillation output output via the oscillation output terminal 104.

According to this second embodiment, the control voltage $V_C$ input to the control voltage input terminal 42 is converted into a current in the voltage controlled current source 41, and the output current $I_0$ which corresponds to the voltage value of the control voltage $V_C$ is output from the voltage controlled current source 41. As a result, the current $I_1$ which has the same current value as the output current $I_0$ flows through the output side circuits 107 through 110 of the current mirror circuit 105. The ring oscillator circuit 121 thus outputs the oscillation outputs having the oscillation frequency corresponding to the current value of the current $I_1$. In addition, the oscillation output of the ring oscillator circuit 121 is output as the oscillation output of the voltage controlled oscillator circuit via the level conversion circuit 91 and the inverter 101.

In this second embodiment, the input transistor of the voltage controlled current source 41 is formed by the depletion type MESFET 43, as in the case of the first embodiment. The source of this depletion type MESFET 43 is connected to the pseudo resistor circuit 44 which may be regarded as being equivalent to a pure resistance having a linear current-voltage characteristic. In addition, the input side of the current mirror circuit 105 has a low impedance, and may essentially be regarded as being a constant voltage, similarly as in the case of the first embodiment. For this reason, even if the tolerable varying range of the control voltage $V_C$ is set large, a satisfactory voltage-current conversion is made, and it is possible to obtain the current $I_1$ which corresponds to the control voltage $V_C$.

Furthermore, in this second embodiment, the output current $I_0$ of the voltage controlled current source 41 is supplied to the input side circuit 106 of the current mirror circuit 105, and the output side circuits 107 through 110 of this current mirror circuit 105 is used as the current sources to drive the ring oscillator circuit 121. However, even if the output current $I_0$ supplied to the input side circuit 106 is varied to a large current value in the current mirror circuit 105, it is possible to flow the current $I_1$ which has the same current value as the output current $I_0$ to the output side circuits 107 through 110.

Therefore, according to this second embodiment, the tolerable varying range of the control voltage $V_C$ can be set large, and it is possible to increase the range of the oscillation frequency.

Moreover, this embodiment provides as the load elements forming the differential circuits 122 through 125 of the ring oscillator circuit 121 the pseudo resistor circuits 134 through 141 which may be regarded as being equivalent to the pure resistance having the linear current-voltage characteristic. For this reason, it is possible to reduce the variation of the oscillation frequency caused by the variation of the power supply voltage $V_{DD}$.

In addition, this second embodiment can obtain the oscillation output having a large amplitude because the ring oscillator circuit 121 that is provided is made up of the differential circuits 122 through 125 which are connected in a ring, and the output of the ring oscillator circuit 121 is obtained via the level conversion circuit 91 and the inverter 101, where the level conversion circuit 91 includes the enhancement type MESFETs 92 and 93 forming a source-follower circuit, the pseudo resistor circuits 94 through 97 and the current mirror circuit 98. The oscillation outputs of the ring oscillator circuit 121 having the same phase are supplied to both the enhancement type MESFETs 92 and 93 of the source-follower circuit. Hence, the frequency range of the oscillation output can be increased compared to the first embodiment.

In this case, the voltage of the oscillation output is dispersed by the enhancement type MESFETs 92 and 93 forming the source-follower circuit, the depletion type MESFETs forming the pseudo resistor circuits 94 through 97 and the enhancement type MESFETs 99 and 100 forming the current mirror circuit 98. Thus, it is possible to prevent an abnormal operation which would occur when the Schottky gate turns ON.

Figure 9:
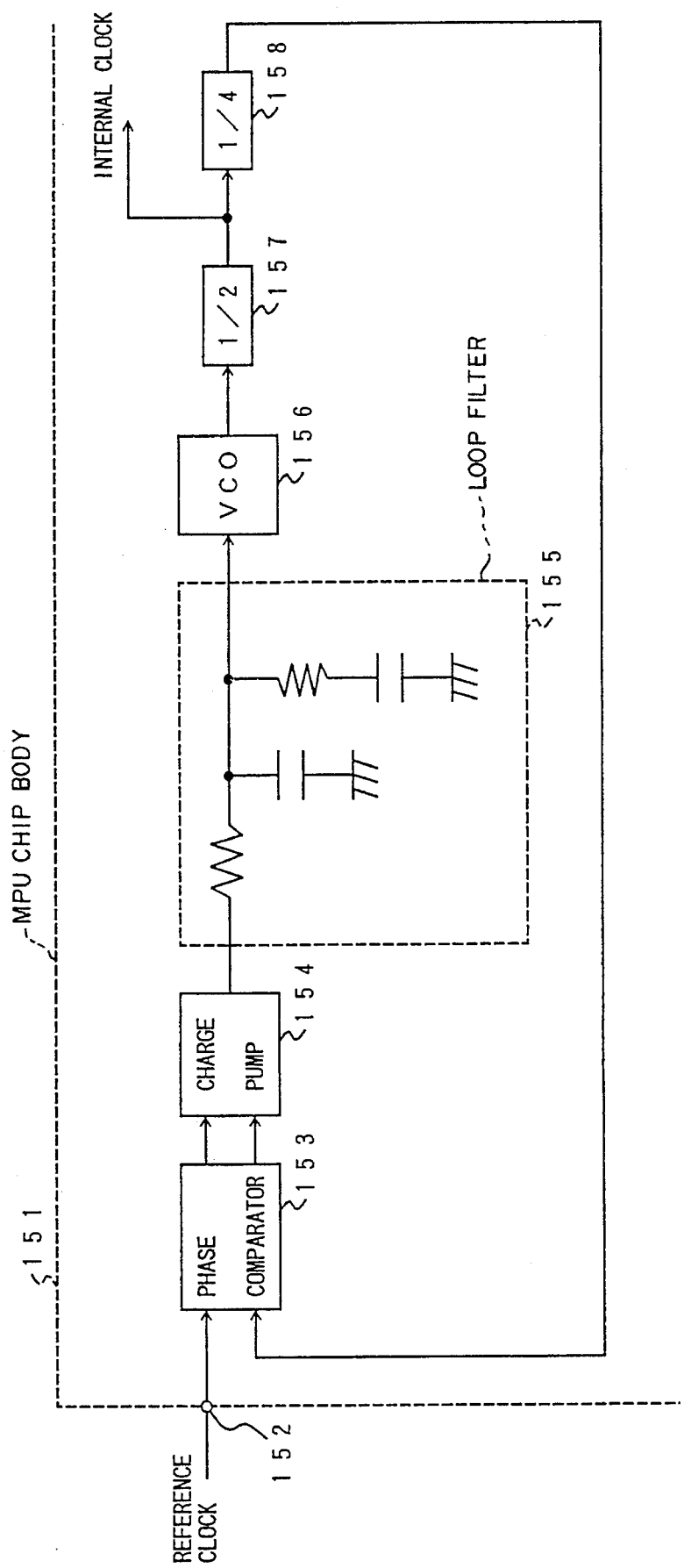
FIG. 9 is a system block diagram showing an application of the present invention.

Next, a description will be given of an application of the present invention, by referring to FIG. 9. In FIG. 9, the present invention is applied to an internal clock signal oscillation circuit which is made of a phase locked loop (PLL) circuit of a MPU.

In FIG. 9, a dotted line indicates a MPU chip body 151. This MPU chip body 151 includes a reference clock input terminal 152 for receiving a reference clock signal, a phase comparator 153, a charge pump circuit 154, a loop filter 155, a voltage controlled oscillator (VCO) circuit 156, a ½ frequency divider 157, and a ¼ frequency divider 158 which are connected as shown. The VCO circuit 156 has the construction of the first or second embodiment of the present invention described above, for example.

In the described embodiments, the MESFETs are used as the transistors. However, it is of course possible to use transistors other than the MESFETs, such as compound semiconductor transistors and metal oxide semiconductor field effect transistors (MOSFETs).

Further, the present invention is not limited to these embodiments, but various variations and modifications may be made without departing from the scope of the present invention.

What is claimed is:

1. A voltage controlled oscillator circuit, comprising:
    a voltage controlled current source supplying a first current which is controlled responsive to a control voltage;
    a current mirror circuit including input side circuit means and output side circuit means, said input side circuit means receiving the first current from said voltage controlled current source;
    an oscillator circuit using the output side circuit means of said current mirror circuit as current source means and having an oscillation frequency which is controlled responsive to a second current of the output side circuit means; and
    an output circuit obtaining an oscillation output of said oscillator circuit, said oscillation output of said oscillator including complementary outputs,
    wherein the output circuit includes two source follower circuits coupled to the complementary outputs, two pseudo resistor circuits, and another current mirror circuit, and
    wherein the two source follower circuits are respectively coupled to input side means and output side means of the another current mirror circuit through the pseudo resistor circuits, and the output is obtained from between the output side means of the another current mirror circuit and the source follower circuit.

2. The voltage controlled oscillator circuit as claimed in claim 1, wherein said oscillator circuit comprises a ring oscillator circuit having an odd number of inverters connected in a ring, said inverters each sharing the output side circuit means of said current mirror circuit as the current source means and including as a load element a first pseudo resistor circuit which may be regarded from a characteristic thereof as being a pure resistance.

3. The voltage controlled oscillator circuit as claimed in claim 2, which further comprises:
    a first power supply line supplying a first power supply voltage; and
    a second power supply line supplying a second power supply voltage which is lower than the first power supply voltage, and wherein said output circuit comprises:
- a buffer circuit including a first inverter having as a load element a second pseudo resistor circuit and supplied with the oscillation output of said oscillator circuit, and a second inverter having as a load element a third pseudo resistor circuit and supplied with an output of the first inverter;
- a level conversion circuit including a fourth pseudo resistor circuit, a fifth pseudo resistor circuit, a first enhancement type transistor having a source coupled directly to said first power supply line or indirectly to said first power supply line via the fourth pseudo resistor circuit and a gate supplied with the output of the first inverter, a second enhancement type transistor having a source coupled directly to said first power supply line or indirectly to said first power supply line via the fifth pseudo resistor circuit and a gate supplied with an output of the second inverter, a sixth pseudo resistor circuit having one end coupled to the source of the first enhancement type transistor, a seventh pseudo resistor circuit having one end coupled to the source of the second enhancement type transistor, and current mirror circuit means having an upstream side portion of a current path of the input side circuit means coupled to the other end of the sixth pseudo resistor circuit and an upstream side portion of a current path of the output side circuit means coupled to the other end of the seventh pseudo resistor circuit; and
- a third inverter having as a load element an eighth pseudo resistor circuit and receiving a voltage at the other end of the seventh pseudo resistor circuit,
- each of said second through eighth pseudo resistor circuits may be regarded from a characteristic thereof as being a pure resistance.

4. The voltage controlled oscillator circuit as claimed in claim 1, wherein said output side circuit means of said current mirror circuit comprises a plurality of output side circuits, and said oscillator circuit comprises a ring oscillator circuit having a plurality of differential circuits connected in a ring, said differential circuits sharing corresponding ones of the output side circuits of said current mirror circuit as the current source means and including as a load element a first pseudo resistor circuit which may be regarded from a characteristic thereof as being a pure resistance.

5. The voltage controlled oscillator circuit as claimed in claim 4, which further comprises:
- a first power supply line supplying a first power supply voltage; and
- a second power supply line supplying a second power supply voltage which is lower than the first power supply voltage,
- and wherein said output circuit comprises:
  - a level conversion circuit including a second pseudo resistor circuit, a third pseudo resistor circuit, a first enhancement type transistor having a source coupled directly to said first power supply line or indirectly to said first power supply line via the second pseudo resistor circuit and a gate supplied with the oscillation output of said oscillator circuit, a second enhancement type transistor having a source coupled directly to said first power supply line or indirectly to said first power supply line via the third pseudo resistor circuit and a gate supplied with the oscillation output of said oscillator circuit, a fourth pseudo resistor circuit having one end coupled to the source of the first enhancement type transistor, a fifth pseudo resistor circuit having one end coupled to the source of the second enhancement type transistor, and current mirror circuit means having an upstream side portion of a current path of the input side circuit means coupled to the other end of the fourth pseudo resistor circuit and an upstream side portion of a current path of the output side circuit means coupled to the other end of the fifth pseudo resistor circuit; and
  - a third inverter having as a load element a sixth pseudo resistor circuit supplied with a voltage at the other end of the fifth pseudo resistor circuit,
  - each of said second through sixth pseudo resistor circuits may be regarded from a characteristic thereof as being a pure resistance.

6. The voltage controlled oscillator circuit as claimed in claim 1, which further comprises:
- a first power supply line supplying a first power supply voltage; and
- a second power supply line supplying a second power supply voltage which is lower than the first power supply voltage,
- and wherein said voltage controlled current source comprises:
  - a depletion type transistor having a drain coupled to said first power supply line and a gate supplied with the control voltage; and
  - a pseudo resistor circuit having one end coupled to the source of the depletion type transistor,
  - said pseudo resistor circuit may be regarded from a characteristic thereof as being a pure resistance.

7. The voltage controlled oscillator circuit as claimed in claim 2, wherein said first pseudo resistor circuit comprises:
- first through nth depletion type transistors each having a gate coupled to a source thereof, where n is an arbitrary integer; and
- a predetermined transistor having a drain coupled to a drain of the first depletion type transistor, a gate coupled to a drain of the nth depletion type transistor, and a source coupled to the source of the nth depletion type transistor,
- said predetermined transistor being one of a depletion type transistor and an enhancement type transistor,
- said drain of the first depletion type transistor forming a most upstream side of a current path,
- said source of the nth depletion type transistor forming a most downstream side of the current path.

8. The voltage controlled oscillator circuit as claimed in claim 1, wherein said current mirror circuit is made up of one or a plurality of stages.

9. The voltage controlled oscillator circuit as claimed in claim 1, wherein said current mirror circuit comprises a Wilson's current mirror circuit having one or a plurality of stages.

* * * * *